(12) United States Patent
Dinh et al.

(10) Patent No.: US 11,107,535 B2
(45) Date of Patent: Aug. 31, 2021

(54) MEMORY DEVICE WITH ADAPTIVE NOISE AND VOLTAGE SUPPRESSION DURING READ-WHILE-WRITE OPERATIONS

(71) Applicant: Adesto Technologies Corporation, Santa Clara, CA (US)

(72) Inventors: John Dinh, Dublin, CA (US); Shane Hollmer, Grass Valley, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 86 days.

(21) Appl. No.: 16/566,402

(22) Filed: Sep. 10, 2019

(65) Prior Publication Data

US 2021/0074365 A1    Mar. 11, 2021

(51) Int. Cl.
*G11C 16/26* (2006.01)
*G11C 7/10* (2006.01)
*G11C 16/12* (2006.01)
*G11C 13/00* (2006.01)

(52) U.S. Cl.
CPC ............ *G11C 16/26* (2013.01); *G11C 7/1006* (2013.01); *G11C 7/106* (2013.01); *G11C 16/12* (2013.01); *G11C 2013/0057* (2013.01)

(58) Field of Classification Search
CPC ..................................................... G11C 16/26
USPC ..................................................... 365/185.21
See application file for complete search history.

(56) References Cited

U.S. PATENT DOCUMENTS

| | | | |
|---|---|---|---|
| 6,222,762 B1 * | 4/2001 | Guterman | G11C 11/5621 257/E27.103 |
| 6,285,593 B1 | 9/2001 | Wong | |
| 6,621,739 B2 | 9/2003 | Gonzales et al. | |
| 7,345,934 B2 | 3/2008 | Guterman et al. | |
| 7,349,255 B2 | 3/2008 | Wong | |
| 8,503,218 B2 | 8/2013 | Kim et al. | |
| 8,654,561 B1 | 2/2014 | Jameson et al. | |
| 9,361,975 B2 | 6/2016 | Gilbert et al. | |
| 9,508,422 B2 | 11/2016 | Tanaka et al. | |
| 9,734,899 B2 | 8/2017 | Tanaka et al. | |
| 2002/0163837 A1 | 11/2002 | Wong | |
| 2012/0155186 A1 | 6/2012 | Chokan et al. | |
| 2014/0254238 A1 * | 9/2014 | Gilbert | G11C 13/004 365/148 |

* cited by examiner

*Primary Examiner* — Muna A Techane
(74) *Attorney, Agent, or Firm* — Michael C. Stephens, Jr.

(57) ABSTRACT

A selection circuit includes: a first selection device coupled between a write IO line and a first node; a second selection device coupled between a read IO line and a second node; a third selection device controllable by a first address decode signal, and coupled between a first bit line and a third node; a fourth selection device controllable by a second address decode signal, and coupled between a second bit line and the third node; a first suppression device controllable by a write enable signal, and coupled between the second node and ground; a second suppression device controllable by a read enable signal, and coupled between the first node and ground; a first isolation device controllable by the write enable signal, and coupled between the first and third nodes; and a second isolation device controllable by the read enable signal, and coupled between the second and third nodes.

20 Claims, 11 Drawing Sheets

MEMORY DEVICE WITH ADAPTIVE NOISE AND VOLTAGE SUPPRESSION DURING READ-WHILE-WRITE OPERATIONS

FIELD OF THE INVENTION

The present invention generally relates to the field of semiconductor devices, and more particularly to control and arrangement of memory devices in order to reduce read latency.

BACKGROUND

Non-volatile memory (NVM) is increasingly found in applications, such as solid-state hard drives, removable digital picture cards, and so on. Flash memory is the predominant NVM technology in use today. However, flash memory has limitations, such as relatively high power, as well as relatively slow operating speeds. In addition, microprocessor performance can be very sensitive to memory read latency, as well as to write throughput. Read and write operations performed simultaneously, such as read operations from one NVM device while performing write operations to another NVM device, can help alleviate NVM access limitations.

DETAILED DESCRIPTION OF EMBODIMENTS

Figure 1:
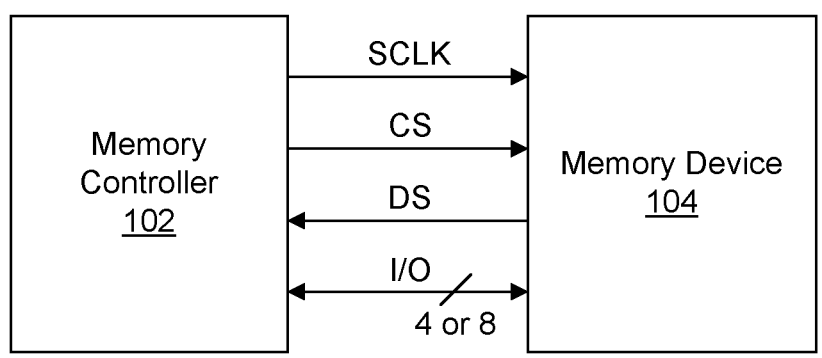
FIG. 1 is a schematic block diagram of an example host and memory device arrangement, in accordance with embodiments of the present invention.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Particular embodiments may be directed to memory devices, including volatile memory, such as SRAM and DRAM, and also including non-volatile memory (NVM), such as flash memory devices, and/or resistive switching memories (e.g., conductive bridging random-access memory [CBRAM], resistive RAM [ReRAM], etc.). Particular embodiments can include structures and methods of operating flash and/or resistive switching memories that can be written (programmed/erased) between one or more resistance and/or capacitive states. In one particular example, a CBRAM storage element may be configured such that when a forward or reverse bias greater than a threshold voltage is applied across electrodes of the CBRAM storage element, the electrical properties (e.g., resistance) of the CBRAM storage element can change. In any event, certain embodiments are suitable to any type of memory device, and in particular NVM devices, such as flash memory devices, and may include resistive switching memory devices in some cases.

Referring now to FIG. 1, shown is an example memory device and host arrangement 100, in accordance with embodiments of the present invention. In this example, a CPU or host 102 can interface with memory device 104, such as via a serial interface. For example, each CPU/host 102 can be any suitable controller (e.g., CPU, MCU, general-purpose processor, GPU, DSP, etc.), and memory device 104 can be any type of memory device (e.g., SRAM, DRAM, PSRAM, EEPROM, Flash, CBRAM, magnetic RAM, ReRAM, etc.). Memory device 104 can thus be implemented in a variety of memory technologies, such as non-volatile types. In some cases, memory device 104 can be a serial flash memory that may be implemented in more traditional non-volatile memories, or in CBRAM/ReRAM resistive switching memories.

Various interface signals, such as in a serial peripheral interface (SPI), can be included for communication between CPUs 102 and memory device 104. For example, serial clock (SCK or SCLK) can provide a clock to device 104, and may be used to control the flow of data to the device. Command, address, and input data (e.g., via I/O pins) can be latched by memory device 104 on a rising edge of SCK, while output data (e.g., via I/O pins) can be clocked out of memory device 104 by SCK or data strobe (DS). Chip select (CS), which may be active low, can be utilized to select memory device 104, such as from among a plurality of such memory devices sharing a common bus or circuit board, or otherwise as a way to access the device. When the chip select signal is de-asserted (e.g., at a high level), memory device 104 can be deselected, and placed in a standby mode. Activating the chip select signal (e.g., via a high to low transition on CS) may be utilized to start an operation, and returning the chip select signal to a high state can be utilized for terminating an operation. For internally self-timed operations (e.g., a program or erase cycle), memory device 104 may not enter standby mode until completion of the particular ongoing operation if chip select is de-asserted during the operation.

In the example interface, data can be provided to (e.g., for write operations, other commands, etc.) and from (e.g., for read operations, verify operations, etc.) memory device 104 via the I/O signals. For example, input data on the I/O can be latched by memory device 104 on edges of SCK, and such input data can be ignored if the device is deselected (e.g., when the chip select signal is de-asserted). Data can be output from memory device 104 via the I/O signals as well. For example, data output from memory device 104 can be clocked out on edges of DS or SCK for timing consistency, and the output signal can be in a high impedance state when the device is deselected (e.g., when the chip select signal is de-asserted).

Figure 2:
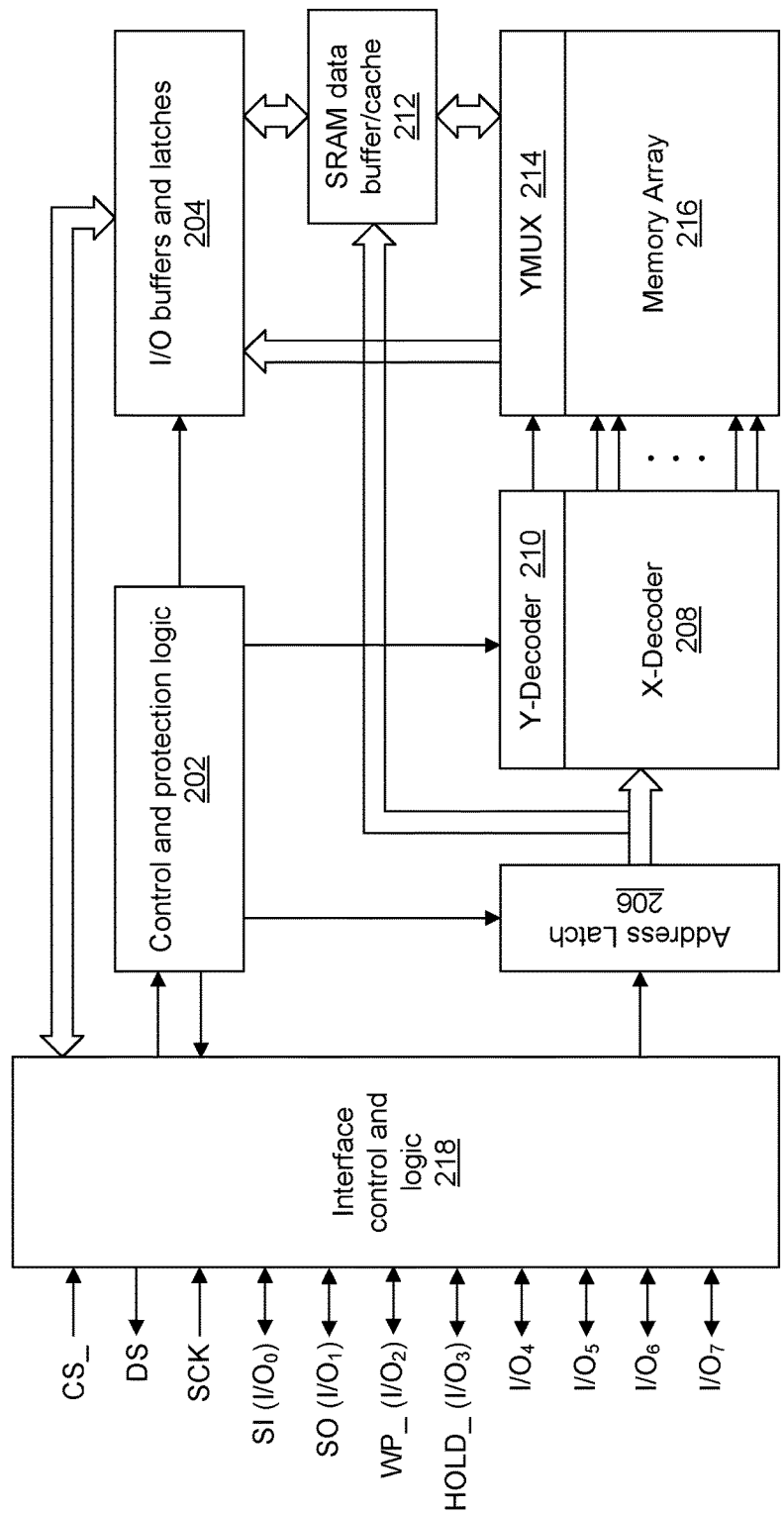
FIG. 2 is a schematic block diagram of an example memory device structure, in accordance with embodiments of the present invention.

Referring now to FIG. 2, shown is a block diagram of an example memory device, in accordance with embodiments of the present invention. Memory device 104 can include interface control and logic 218, which may manage the interface (e.g., SPI interface), and decode the command and address information. Control and protection logic 202 can include control circuitry for reading and writing to the memory array, including address mapping and control for byte access and group addressing/ordering, as will be discussed in more detail below. For example, control and protection logic 202 can include a command decoder, registers for command execution parameters (e.g., read parameters, program/erase parameters, etc.), as well as a controller for command execution.

I/O buffers and latches 204 can control the input of data from interface control and logic 206, and the output of data to interface control and logic 218. For example, chip select based control and clock based control of data read from memory array 216 can be accommodated via I/O buffers and latches 204. That is, registers/latches in I/O buffers and latches 204 can be controlled by way of the toggling of SCK during burst reads and sequential fetch operations, as described herein. SRAM data buffer(s)/cache 212 can buffer/store data between memory array 216 and I/O buffers and latches 204. Address latch block 206 can receive address information via interface control and logic 218, and may provide latched addresses to X-decoder 208 for row addresses, to Y-decoder 210 for column addresses, and to SRAM data buffer(s)/cache 212.

The addresses provided from address latch 206 to SRAM data buffer/cache 212 may be used to search for a match/hit or miss of the requested data from memory cache 212. Thus, if the requested data is found in buffer/cache 212 via the address matching, the requested data can be directly supplied to I/O buffers and latches 204 for direct outputting, as opposed to accessing that data from memory array 216. Incrementing of addresses can be performed via address latch block 206 and/or control and protection logic 202. Y-decoder 210 can provide column addresses to Y-Gating or YMUX 214, which can include pass gates or the like to multiplex I/O lines to/from memory array 216. As discussed above, memory array 216 can include an array of volatile memory cells, or non-volatile memory cells (e.g., CBRAM, ReRAM, flash, etc.).

Figure 3:
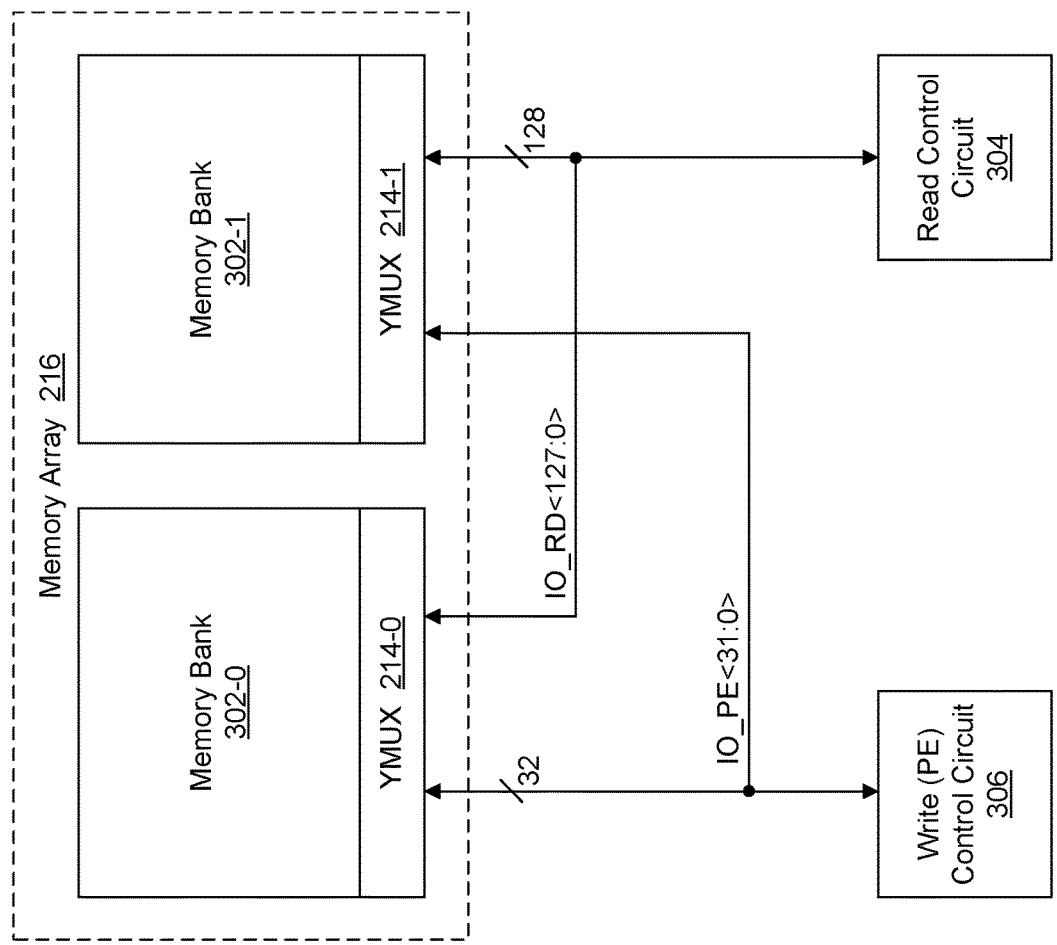
FIG. 3 is a block diagram of an example IO and control arrangement with banks of the memory device, in accordance with embodiments of the present invention.

Referring now to FIG. 3, shown is a block diagram 300 of an example IO and control arrangement with banks of the memory device, in accordance with embodiments of the present invention. Memory array 216 can include memory banks 302-0 and 302-1. In order to provide access paths between memory array 216 and the input/output lines, YMUX 214 may be provided. YMUX 214-0 can interface between memory bank 302-0 and the input/output lines. Input/output lines IO_PE<31:0> can interface between write (program/erase) control circuit 306 and YMUX circuits 214. Input/output lines IO_RD<127:0> can interface between read control circuit 306 and YMUX circuits 214. While two memory banks are generally described herein, any number of memory banks (e.g., 2, 4, 8, etc.) and associated multiplexer circuits can be employed within a single memory device in particular embodiments.

Due to the shared or common paths between read and write (program/erase) operations in a multi-sector/bank memory device, noise and voltage ramping up or down while read operation is ongoing could interfere with the ongoing write operation as part of read-while-write (RWW) functionality. For example, transitions on a shared read input/output line IO_RD can interfere with an ongoing write operation, such as by way of capacitive coupling within YMUX 214. The same impact of noise and voltage ramping up or down from the write operation could interfere with the read operation. For example, transitions on a shared write input/output line IO_PE can interfere with an ongoing read operation, such as by way of capacitive coupling within YMUX 214. Due to noise interference between the two simultaneous RWW operations (for a two memory bank system), a more narrow range of read frequencies, or possibly incorrect read data states, may result.

Figure 4:
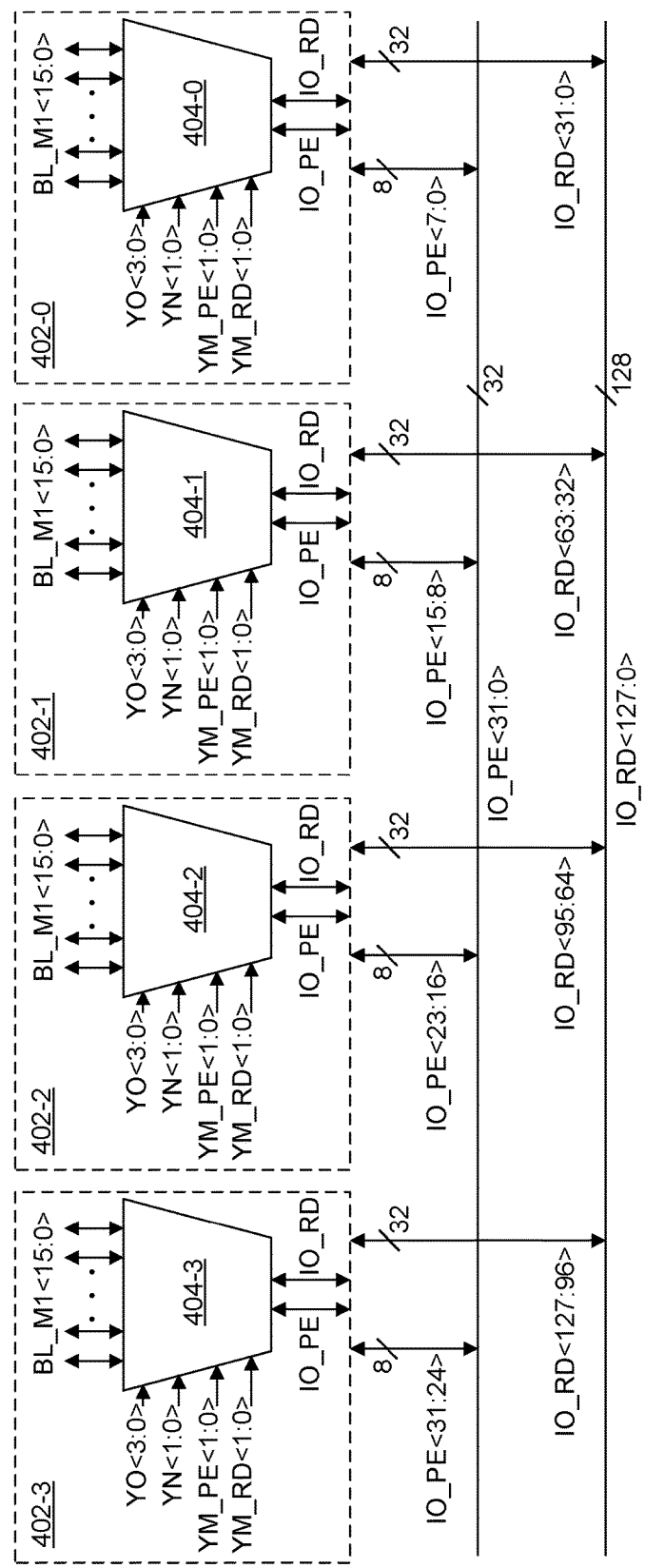
FIG. 4 is a block diagram of an example YMUX selection and control for reading and writing data, in accordance with embodiments of the present invention.

Referring now to FIG. 4, shown is a block diagram of an example YMUX selection and control for reading and writing data, in accordance with embodiments of the present invention. YMUX selection circuit 214 can include selection circuits 402. Depending on the number of bit lines (BL) that are shared among the memory cells in portions of memory array 216, write input/output lines (IO_PE), and read input output lines (IO_RD), the number and arrangement of selection and multiplexer circuits can vary. In this particular example, selection circuits 402-0, 402-1, 402-2, and 402-3 may together correspond to one memory bank, and input/output lines IO_PE and IO_RD can be shared between multiple memory banks.

It should also be noted that multiple selection circuits 402 and/or 404 may be included for a given memory bank. For example, each selection circuit 402 may map to 512 bit lines, 8 IO_PE lines, and 32 IO_RD lines. Thus in this particular example, the full memory bank may accommodate 2048 bit lines, 32 IO_PE lines, and 128 IO_RD lines. Also in this particular example, the read operation may be fully parallel, while the write operation may be more serial in nature, and thus the difference in the number of read input/output lines versus write input/output lines. Particular embodiments may accommodate any suitable number of memory banks, bit lines, and read and write input/output lines, as well as parallel and/or serial types of memory access. In addition, each memory bank can support both read and write operations, while RWW functionality may be supported across multiple memory banks.

In selection circuit 404-0, 16 groups of bit lines BL_M1<15:0> can be mapped to write input/output lines IO_PE<7:0> and read input/output lines IO_RD<31:0> by control of address decoded write enable signals YM_PE<1:0>, address decoded read enable signals YM_RD<1:0>, and address decode signals YO<3:0> and YN<1:0>. For example, an "address decoded write enable signal" can include address (e.g., column or Y-address) information, as well as program/erase operation control or enable signaling. Similarly, an "address decoded read enable signal" can include address (e.g., column or Y-address) information, as well as read operation control or enable signaling. Also, an "address decode signal" may only include decoded address (e.g., column or Y-address) information. As shown herein, variations of these signals can be used to select, e.g., one of 16 bit lines to map to one of the read or write input/output lines IO_RD or IO_PE.

The same address decoded write enable signals YM_PE<1:0>, address decoded read enable signals YM_RD<1:0>, and address decode signals YO<3:0> and YN<1:0> can be employed in selection circuit 404-1 to map 16 groups of other bit lines BL_M1<15:0> to write input/output lines IO_PE<15:8> and read input/output lines IO_RD<63:32>, in selection circuit 404-2 to map 16 groups of other bit lines BL_M1<15:0> to write input/output lines IO_PE<23:16> and read input/output lines IO_RD<95:64>, and in selection circuit 404-3 to map 16 groups of other bit lines BL_M1<15:0> to write input/output lines IO_PE<31:24> and read input/output lines IO_RD<127:96>. In this way, 2048 bit lines of a full memory bank can be mapped to 32 IO_PE lines and 128 IO_RD lines. In addition, these IO_PE and IO_RD lines can be shared with one or more other memory banks 302 in memory array 216.

Figure 5:
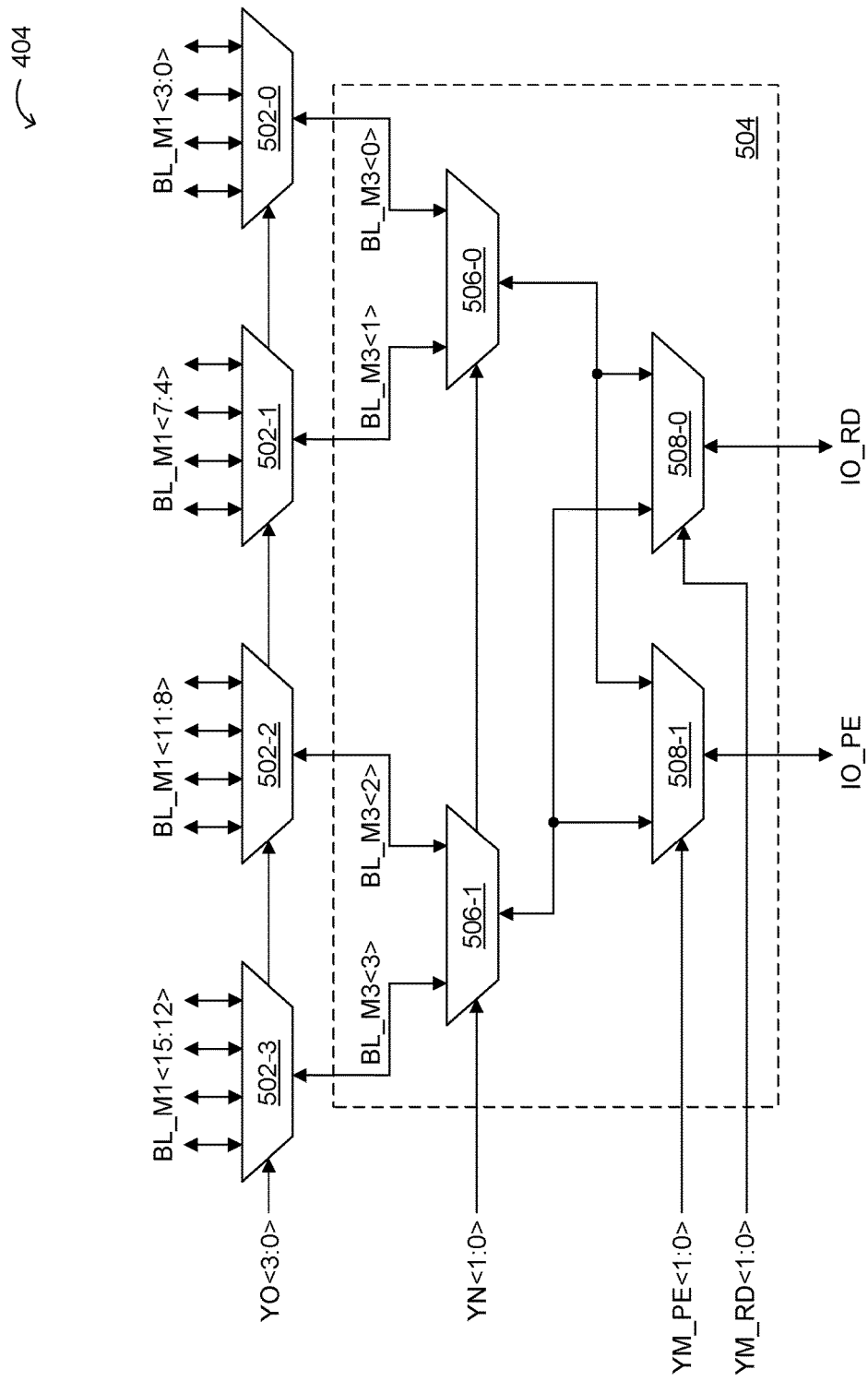
FIG. 5 is a block diagram of an example YMUX selection circuit portion, in accordance with embodiments of the present invention.

Referring now to FIG. 5, shown is a block diagram of an example YMUX selection circuit portion, in accordance with embodiments of the present invention. Multiplexer 404 can include multiplexers 502-0, 502-1, 502-2, and 502-3 to map 4-bit portions of BL_M1<15:0> to selection circuit 504 based on address decode signals YO<3:0>. Selection circuit 504 can include multiplexers 506-0 and 506-1 to map 2-bit portions of selected bit line signals BL_M3<3:0> to multiplexers 508 based on address decode signals YN<1:0>. Multiplexer 508-0 can be controlled by address decoded read enable signals YM_RD<1:0> to provide access between multiplexer 506-0 and read input/output line IO_RD. Multiplexer 508-1 can be controlled by address decoded write enable signals YM_PE<1:0> to provide access between multiplexer 506-1 and write input/output line IO_PE. It should be noted that any suitable variation of multiplexer and address/decode signal control can be employed in certain embodiments.

Figure 6:
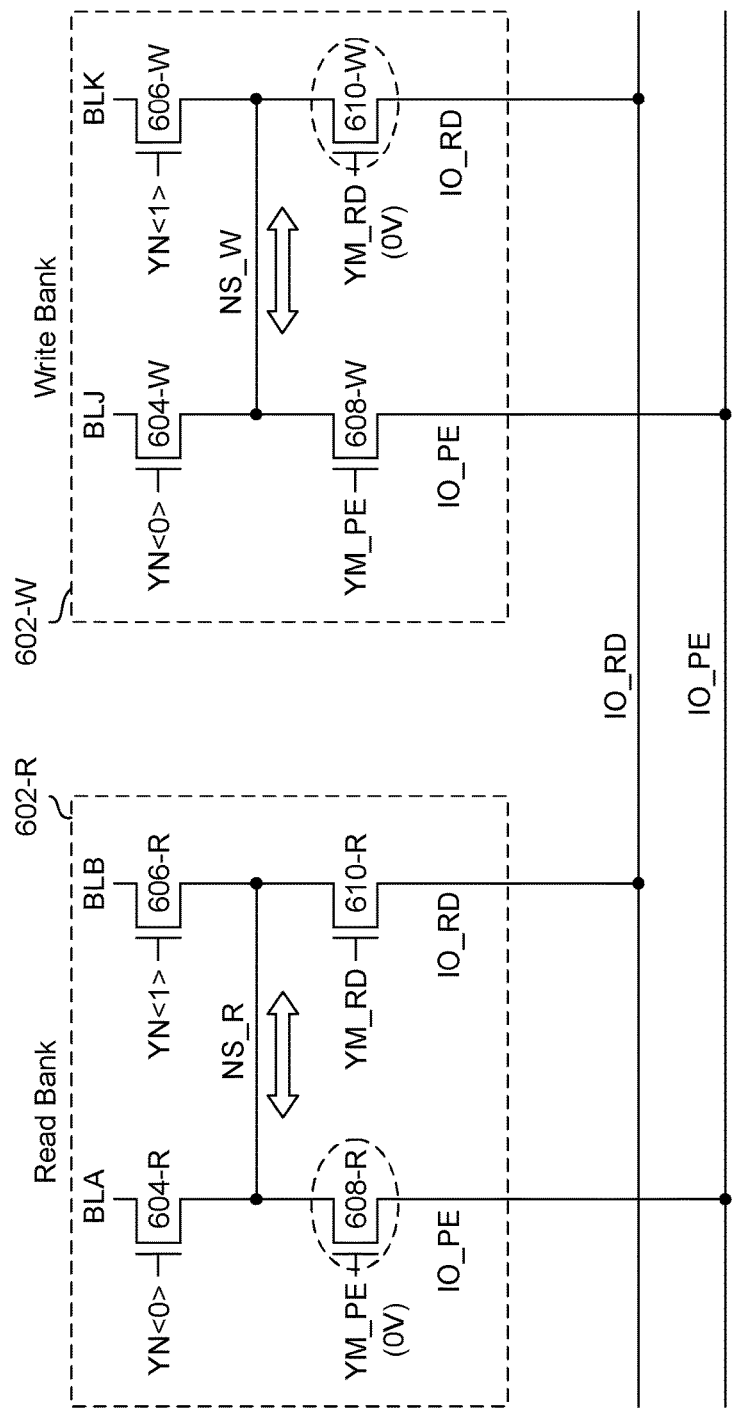
FIG. 6 is a schematic block diagram of first example YMUX selection circuits for read and write memory banks, in accordance with embodiments of the present invention.

Referring now to FIG. 6, shown is a schematic block diagram of first example YMUX selection circuits 600 for read and write memory banks, in accordance with embodiments of the present invention. YMUX selection circuit 600 can represent an example portion of the circuitry in selection circuit 504, but spanning across different memory banks. As discussed above, to support read-while-write (RWW) operation, a memory bank engaged in a read operation may share IO_RD and IO_PE lines with another memory bank that is engaged in a write operation.

Here, selection circuit 602-R that corresponds to a memory bank configured for reads (e.g., currently undergoing a read operation), can include selection device 604-R controllable by address decode signal YN<0> and that can connect between bit line BLA and node NS-R, selection device 606-R controllable by address decode signal YN<1> and that can connect between bit line BLB and node NS-R, selection device 608-R controllable by address decoded write enable signal YM_PE and that can connect between node NS-R and write input/output line IO_PE, and selection device 610-R controllable by address decoded read enable signal YM_RD and that can connect between node NS-R and read input/output line IO_RD. For example, the bit line voltage can be set at about 0.6V, YM_PE can be low for the read bank, and YM_RD can be low for the write bank. A noise injection path for the read bank can result from transitions or voltage swings (e.g., between about 1V and about 7V) on IO_PE, and through selection device 608-R, which can affect the stability node NS-R for the read operation. This variation on node NS-R can lead to incorrect data values being read out, or introduce timing problems (e.g., delays) in the read operation.

Selection circuit 602-W that corresponds to a memory bank configured for write operations (e.g., currently undergoing a program/erase operation), can include selection device 604-W controllable by address decode signal YN<0> and that can connect between bit line BLJ and node NS-W, selection device 606-W controllable by address decode signal YN<1> and that can connect between bit line BLK and node NS-W, selection device 608-W controllable by address decoded write enable signal YM_PE and that can connect between node NS-W and write input/output line IO_PE, and selection device 610-W controllable by address decoded read enable signal YM_RD and that can connect between node NS-W and read input/output line IO_RD. A noise injection path for the write bank can result from transitions or voltage swings on IO_RD for the read operation, and through selection device 610-W, which can affect the stability of node NS-W for the write operation.

Figure 7:
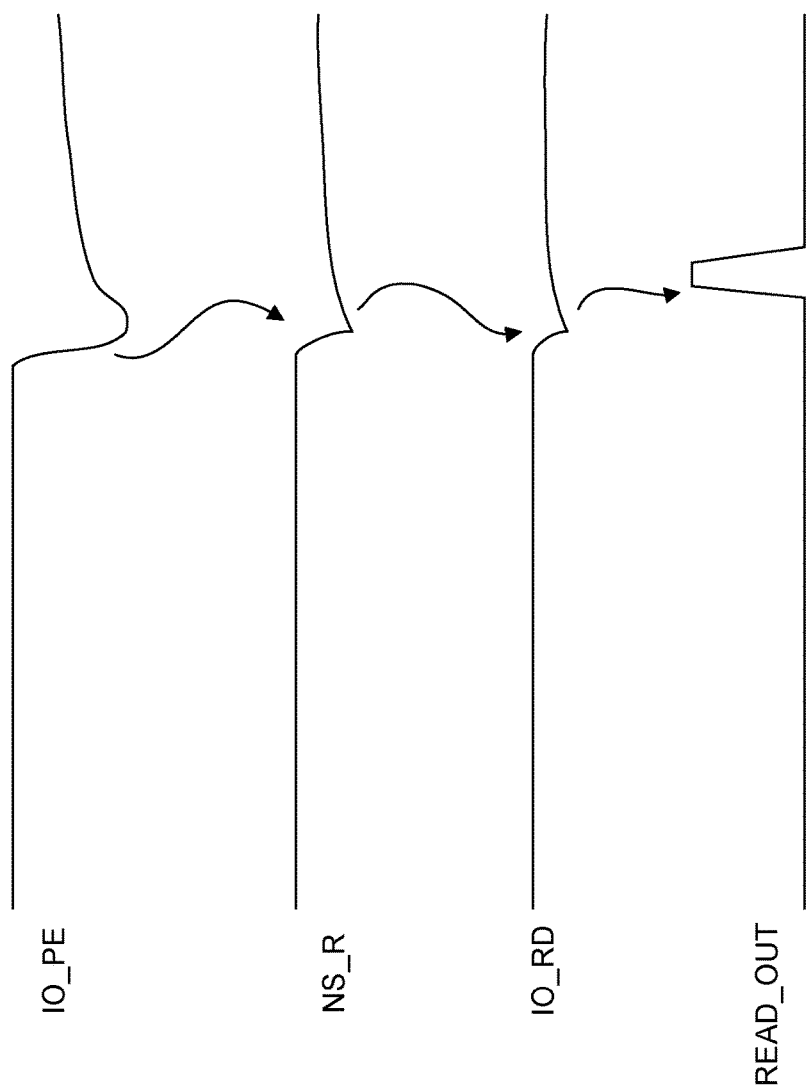
FIG. 7 is a waveform diagram of example operation of the YMUX selection circuitry of FIG. 6, in accordance with embodiments of the present invention.

Referring now to FIG. 7, shown is a waveform diagram of example operation 700 of the YMUX selection circuitry of FIG. 6, in accordance with embodiments of the present invention. In this example, transitions on the shared write input/output line IO_PE due to the ongoing write operation can affect common node NS_R in selection circuit 602-R corresponding to a read memory bank and supporting the ongoing read operation. This can then impact read input/output line IO_RD (e.g., by about 160 mV) and if this dip is sufficiently large can result in an incorrect reading of the data state (e.g., READ_OUT) of an accessed memory cell and corresponding to the selected bit line from the read memory bank. Thus, the read operation may be disturbed in this case, and, e.g., a 1 value may be output instead of the correct 0 data value due to this noise interference from the write operation via write input/output line IO_PE. Similarly, the write operation may be disturbed due to noise interference from the ongoing read operation via read input/output line IO_RD.

In one embodiment, a selection circuit configured to multiplex between shared read and write IO lines and bit lines in a memory array having first and second memory banks, can include: (i) a first selection device controllable by an address decoded write enable signal, and coupled between the write IO line and a first node; (ii) a second selection device controllable by an address decoded read enable signal, and coupled between the read IO line and a second node; (iii) a third selection device controllable by a first address decode signal, and coupled between a first bit line and a third node; (iv) a fourth selection device controllable by a second address decode signal, and coupled between a second bit line and the third node; (v) a first suppression device controllable by a write enable signal, and coupled between the second node and ground; (vi) a second suppression device controllable by a read enable signal, and coupled between the first node and ground; (vii) a first isolation device controllable by the write enable signal, and coupled between the first node and the third node; and (viii) a second isolation device controllable by the read enable signal, and coupled between the second node and the third node.

Figure 8:
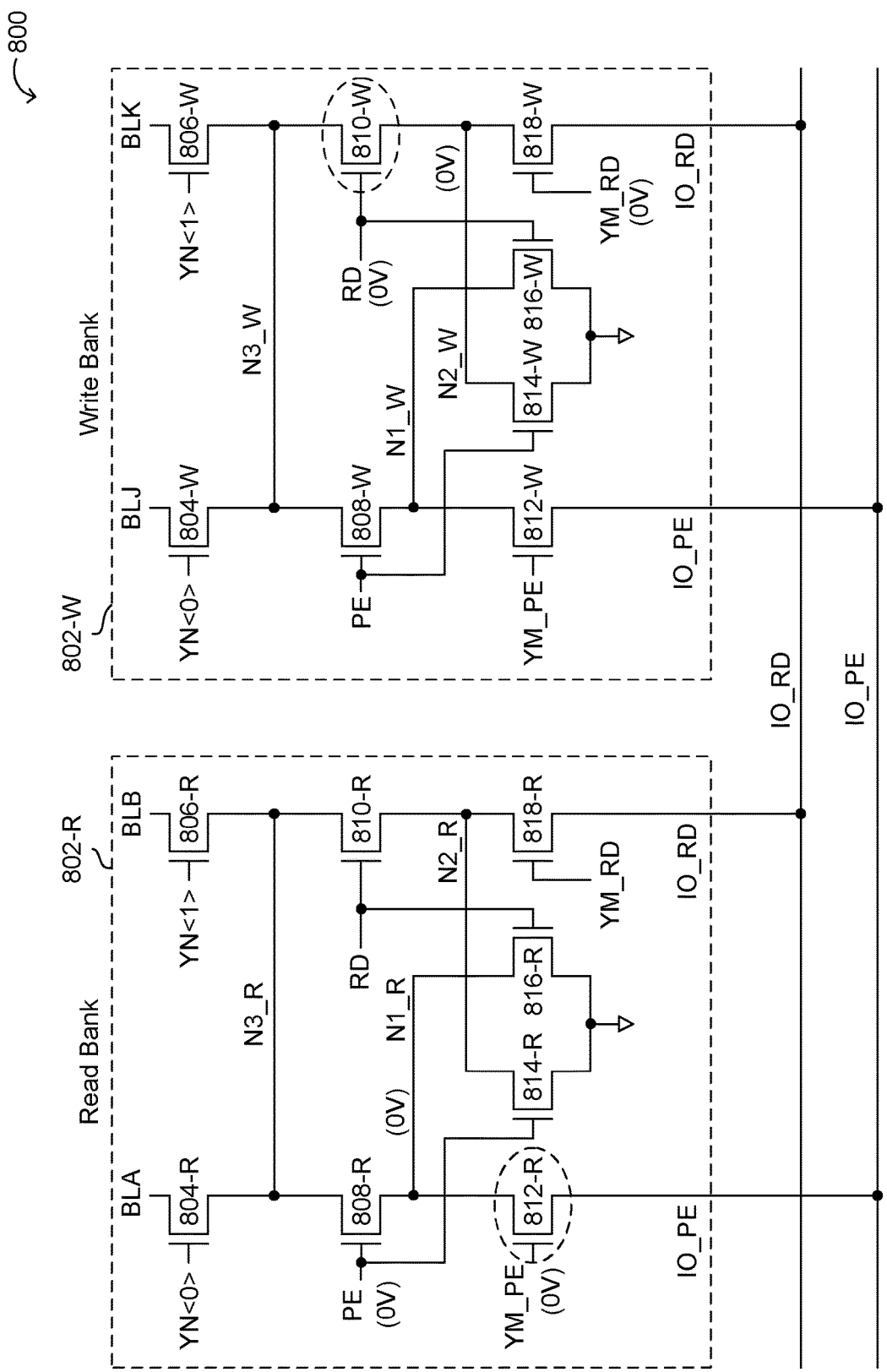
FIG. 8 is a schematic block diagram of second example YMUX selection circuits for read and write memory banks, in accordance with embodiments of the present invention.

Referring now to FIG. 8, shown is a schematic block diagram of second example YMUX selection circuits 800 for read and write memory banks, in accordance with embodiments of the present invention. Selection circuit 802-R that corresponds to a memory bank configured for reads (e.g., currently undergoing a read operation), can include selection device 804-R controllable by address decode signal YN<0> and that can connect between bit line BLA and node N3-R, selection device 806-R controllable by address decode signal YN<1> and that can connect between bit line BLB and node N3-R, selection device 812-R controllable by address decoded write enable signal YM_PE and that can connect between node N1-R and write input/output line IO_PE, and selection device 818-R controllable by address decoded read enable signal YM_RD and that can connect between node N2-R and read input/output line IO_RD.

Selection circuit 802-R can also include suppression device 814-R controllable by write enable signal PE and that can connect between node N2-R and ground, and suppression device 816-R controllable by read enable signal RD and that can connect between node N1-R and ground. In an example read operation, control signal RD may go high for the read bank in order to turn on suppression device 816-R to discharge node N1-R to suppress noise from write input/output line IO_PE through selection device 812-R. For the read bank, suppression device 814-R may remain off due to control signal PE being low for this memory bank. It should be noted that, while suppression devices 814-R and 816-R are shown here as an MOSFET transistors, other transistors (e.g., bipolar-junction transistors [BJTs], etc.) may also be utilized in certain embodiments.

Selection circuit 802-R can also include isolation device 808-R controllable by write enable signal PE and that can connect between nodes N3-R and N1-R, and isolation device 810-R controllable by read enable signal RD and that can connect between nodes N3-R and N2-R. These isolation devices 808-R and 810-R can be employed in order to isolate node N3-R from noise from node N1-R or N2-R, depending on the type of operation. In an example read operation, control signal PE may be low for the read bank in order to turn off isolation device 808-R to isolate node N3-R from possible noise on node N1-R through selection device 812-R due to transitions on write input/output line IO_PE. For the read bank, isolation device 810-R may be on due to control signal RD being high for this memory bank, which allows accesses of bit lines BLA and BLB via node N3-R.

Selection circuit 802-W that corresponds to a memory bank configured for write operations (e.g., currently undergoing a program/erase operation), can include selection device 804-W controllable by address decode signal YN<0> and that can connect between bit line BLJ and node NS-W, selection device 806-W controllable by address decode signal YN<1> and that can connect between bit line BLK and node NS-W, selection device 812-W controllable by address decoded write enable signal YM_PE and that can connect between node N1-W and write input/output line IO_PE, and selection device 818-W controllable by address decoded read enable signal YM_RD and that can connect between node N2-W and read input/output line IO_RD.

Selection circuit 802-W can also include suppression device 814-W controllable by write enable signal PE and that can connect between node N2-W and ground, and suppression device 816-W controllable by read enable signal RD and that can connect between node N1-W and ground. In an example write operation, control signal PE may go high for the write bank in order to turn on suppression device 814-W to discharge node N2-W to suppress noise from read input/output line IO_RD through selection device 818-W. For the write bank, suppression device 816-W may remain off due to control signal RD being low for this memory bank. It should be noted that, while suppression devices 814-W and 816-W are shown here as an MOSFET transistors, other transistors (e.g., BJTs, etc.) may also be utilized in certain embodiments.

Selection circuit 802-W can also include isolation device 808-W controllable by write enable signal PE and that can connect between nodes N3-W and N1-W, and isolation device 810-W controllable by read enable signal RD and that can connect between nodes N3-W and N2-W. These isolation devices 808-W and 810-W can be employed in order to isolate node N3-W from noise from node N1-W or N2-W, depending on the type of operation. In an example write operation, control signal RD may be low for the write bank in order to turn off isolation device 810-W to isolate node N3-W from possible noise on node N2-W through selection device 818-W due to transitions on read input/output line IO_RD. For the write memory bank, isolation device 808-W may be on due to control signal PE being high for this memory bank, which allows accesses of bit lines BLJ and BLK via node N3-W.

In some cases, address decoded write enable signal YM_PE may essentially be the same as write enable signal PE, and address decoded read enable signal YM_RD may be the same as read enable signal RD. However, in other cases, write enable signal PE and read enable signal RD may be static signals, while address decoded write enable signal YM_PE and address decoded read enable signal YM_RD may transition in each access cycle of the selection circuit. As used herein, a "static" may be a control signal that remains high or low over multiple selection circuit access cycles, such as to indicate when the device is in a read or a write operation. The use of such a static signal in this case can speed up read/write timing through the transistor stack.

Figure 9:
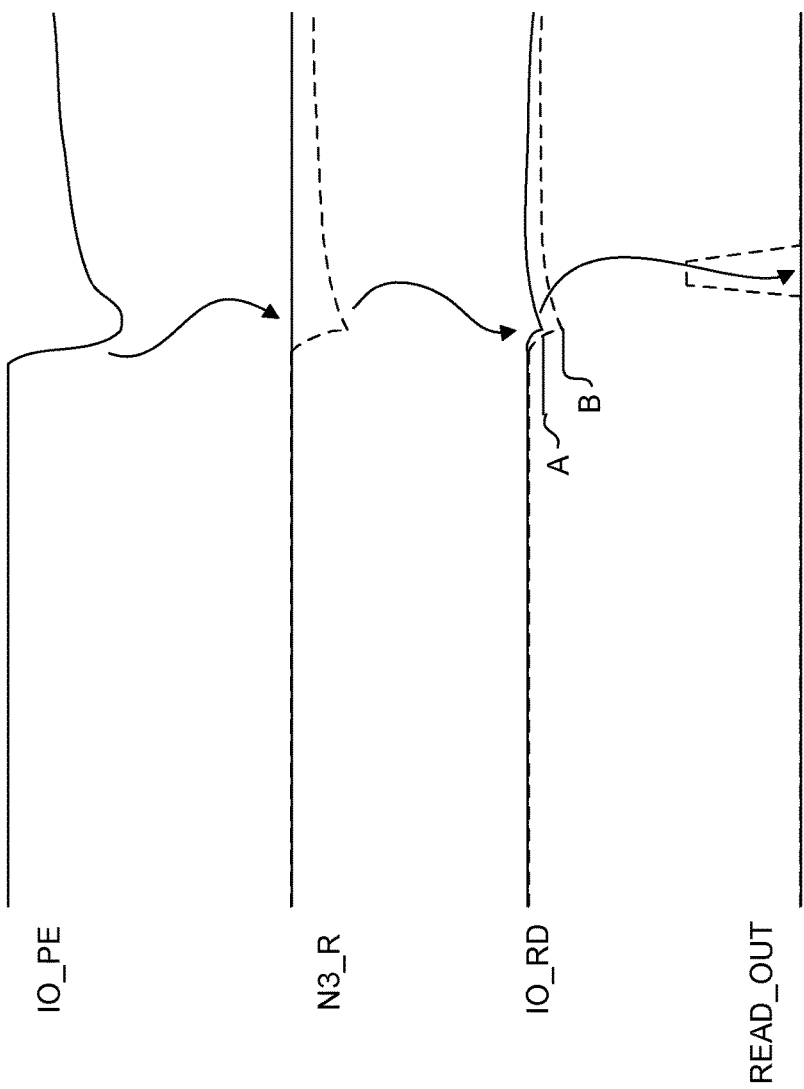
FIG. 9 is a waveform diagram of example operation of the YMUX selection circuitry of FIG. 8, in accordance with embodiments of the present invention.

Referring now to FIG. 9, shown is a waveform diagram of example operation 900 of the YMUX selection circuitry of FIG. 8, in accordance with embodiments of the present invention. In this example, transitions on the shared write input/output line IO_PE can affect common node N3_R in selection circuit 802-R corresponding to a read memory bank and supporting the ongoing read operation. In this particular case, the impact read input/output line IO_RD may be reduced (e.g., to level A from level B in the example above), such that a correct reading of the data state of a memory cell corresponding to the access bit line from the read memory bank can be provided. In one example, the impact on read input/output line IO_RD can be reduced from about 160 mV to about 36 mV, and the data state (e.g., READ_OUT) of an accessed memory cell and corresponding to the selected bit line from the read memory bank may not be disturbed. As such, e.g., a correct 0 value may be output instead of the incorrect 1 data value due to the reduction in noise interference from the write operation via write input/output line IO_PE. Similarly, the write operation may not be substantially disturbed in this case due to noise interference from the ongoing read operation via read input/output line IO_RD.

In one embodiment, a selection circuit configured to multiplex between shared read and write IO lines and bit lines in a memory array having first and second memory banks, can include: (i) a first selection device controllable by a first address decoded write enable signal, and coupled between the write IO line and a first node; (ii) a second selection device controllable by a first address decoded read enable signal, and coupled between the read IO line and a second node; (iii) a first suppression device controllable by the first address decoded write enable signal, and coupled between the second node and ground; (iv) a second suppression device controllable by the first address decoded read enable signal, and coupled between the first node and ground; (v) a first selection/isolation device controllable by a second address decoded write enable signal, and coupled between a first bit line and the first node; (vi) a second selection/isolation device controllable by a third address decoded write enable signal, and coupled between a second bit line and the first node; (vii) a third selection/isolation device controllable by a fourth address decoded write enable signal, and coupled between the first bit line and the second node; and (viii) a fourth selection/isolation device controllable by a fifth address decoded write enable signal, and coupled between the second bit line and the second node.

Figure 10:
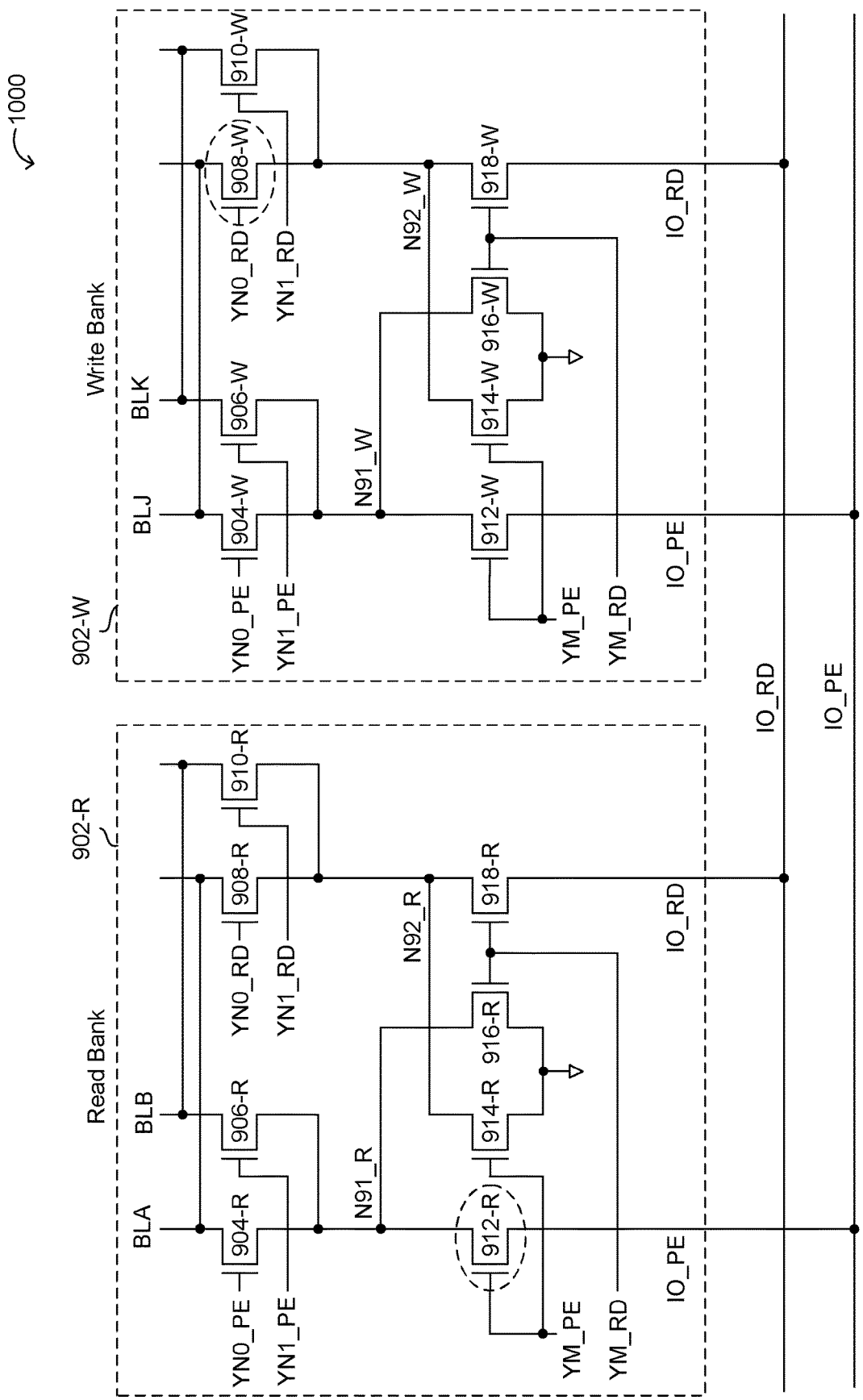
FIG. 10 is a schematic block diagram of third example YMUX selection circuits for read and write memory banks, in accordance with embodiments of the present invention.

Referring now to FIG. 10, shown is a schematic block diagram of third example YMUX selection circuits 1000 for read and write memory banks, in accordance with embodiments of the present invention. Selection circuit 902-R that corresponds to a memory bank configured for reads, can include selection/isolation device 904-R controllable by address decoded write enable signal YN0_PE and that can connect between bit line BLA and node N91-R, selection/isolation device 906-R controllable by address decoded write enable signal YN1_PE and that can connect between bit line BLB and node N91-R, selection/isolation device 908-R controllable by address decoded read enable signal YN0_RD and that can connect between bit line BLA and node N92-R, and selection/isolation device 910-R controllable by address decoded read enable signal YN1_RD and that can connect between bit line BLB and node N92-R.

Selection circuit 902-R can also include selection device 912-R controllable by address decoded write enable signal YM_PE and that can connect between node N91-R and write input/output line IO_PE, and selection device 918-R controllable by address decoded read enable signal YM_RD and that can connect between node N92-R and read input/output line IO_RD. Selection circuit 902-R can also include suppression device 914-R controllable by address decoded write enable signal YM_PE and that can connect between node N92-R and ground, and suppression device 916-R controllable by address decoded read enable signal YM_RD and that can connect between node N91-R and ground.

In an example read operation, address decoded read enable signal YM_RD may go high for the read bank in order to turn on suppression device 916-R to discharge node N91-R to suppress noise from write input/output line IO_PE through selection device 912-R. For the read bank, suppression device 914-R may remain off due to address decoded write enable signal YM_PE being low for this memory bank. It should be noted that, while suppression devices 914-R and 916-R are shown here as an MOSFET transistors, other transistors (e.g., BJTs, etc.) may also be utilized in certain embodiments.

Also in the example read operation on the read memory bank, selection/isolation devices 904-R and 906-R can be off due to address decoded write enable signals YN0_PE and YN1_PE being low. This can effectively isolate the bit lines and node N92-R from possible noise on node N91-R through selection device 912-R due to transitions on write input/output line IO_PE. In addition, only one of selection/isolation devices 908-R and 910-R may be turned on during the read operation in order to select one of bit lines BLA and BLB to map to node N92-R. By utilizing transistors 904-R, 906-R, 908-R, and 910-R as both selection and isolation devices, noise from IO_PE can be isolated from the read access path of selection circuit 902-R.

Selection circuit 902-W that corresponds to a memory bank configured for write operations, can include selection/isolation device 904-W controllable by address decoded write enable signal YN0_PE and that can connect between bit line BLJ and node N91-W, selection/isolation device 906-W controllable by address decoded write enable signal YN1_PE and that can connect between bit line BLK and node N91-W, selection/isolation device 908-W controllable by address decoded read enable signal YN0_RD and that can connect between bit line BLJ and node N92-W, and selection/isolation device 910-W controllable by address decoded read enable signal YN1_RD and that can connect between bit line BLK and node N92-W.

Selection circuit 902-W can also include selection device 912-W controllable by address decoded write enable signal YM_PE and that can connect between node N91-W and write input/output line IO_PE, and selection device 918-W controllable by address decoded read enable signal YM_RD and that can connect between node N92-W and read input/output line IO_RD. Selection circuit 902-W can also include suppression device 914-W controllable by address decoded write enable signal YM_PE and that can connect between node N92-W and ground, and suppression device 916-W controllable by address decoded read enable signal YM_RD and that can connect between node N91-W and ground.

In an example write operation, address decoded write enable signal YM_PE may go high for the write memory bank in order to turn on suppression device 914-W to discharge node N92-W to suppress noise from read input/output line IO_RD through selection device 918-W. For the write bank, suppression device 916-W may remain off due to address decoded read enable signal YM_RD being low for this memory bank. It should be noted that, while suppression devices 914-W and 916-W are shown here as an MOSFET transistors, other transistors (e.g., bipolar-junction transistors [BJTs], etc.) may also be utilized in certain embodiments.

Also in the example write operation on the write memory bank, selection/isolation devices 908-W and 910-W can be off due to address decoded read enable signals YN0_RD and YN1_RD being low. This can effectively isolate the bit lines and node N91-W from possible noise on node N92-W through selection device 918-W due to transitions on read input/output line IO_RD. In addition, only one of selection/isolation devices 904-W and 906-W may be turned on during the write operation in order to select one of bit lines BLJ and BLK to map to node N91-W. By utilizing transistors 904-W, 906-W, 908-W, and 910-W as both selection and isolation devices, noise from IO_RD can be isolated from the write access path of selection circuit 902-W.

Figure 11:
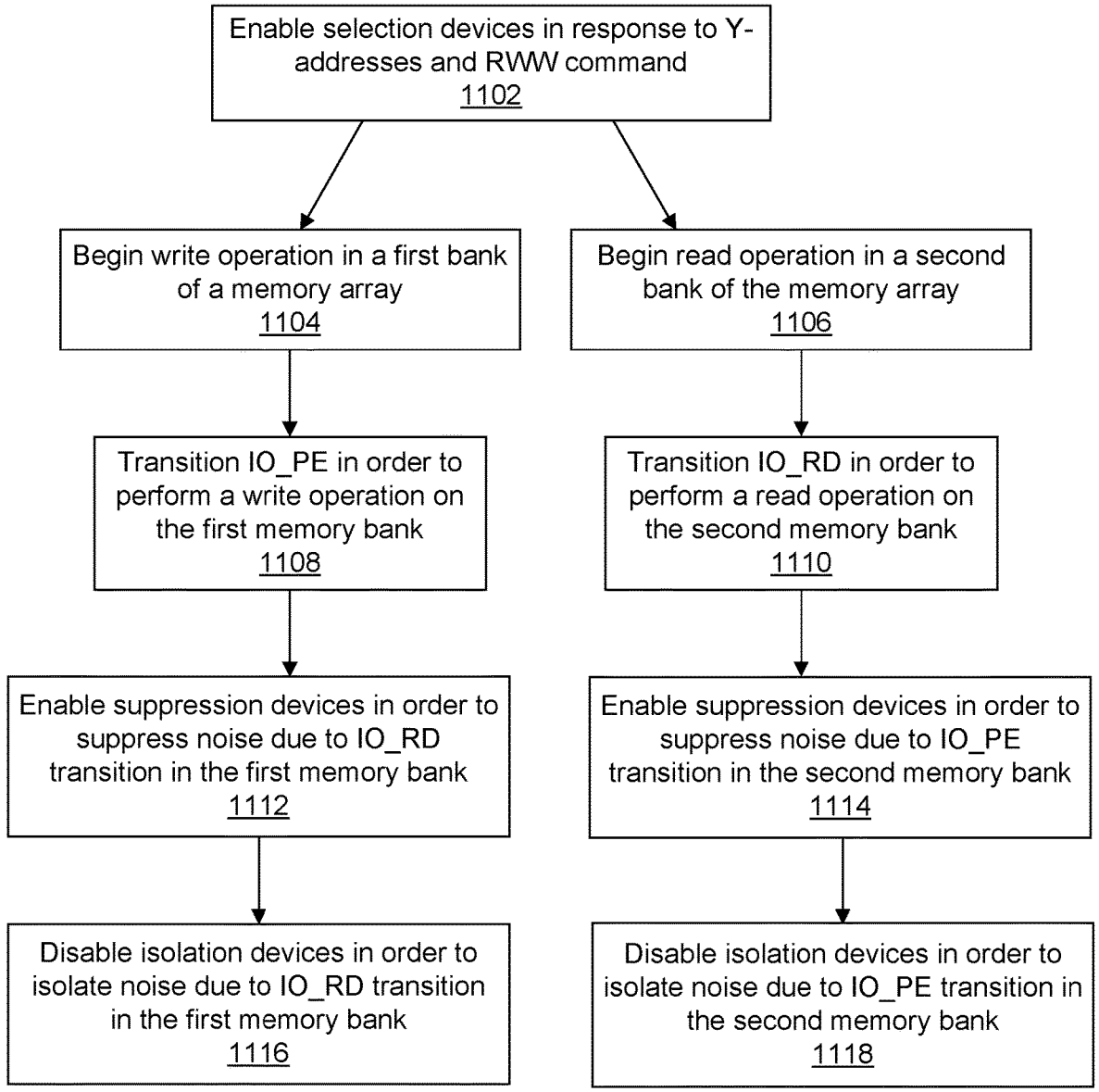
FIG. 11 is a flow diagram of an example method of performing a read-while-write (RWW) operation, in accordance with embodiments of the present invention.

Referring now to FIG. 11, shown is a flow diagram of an example method of performing a read-while-write (RWW) operation, in accordance with embodiments of the present invention. Example 1100 can be utilized in the operation of the example selection circuits of FIGS. 8 and 10. At 1102, selection devices can be enabled in response to Y-address (e.g., column address) decoding and a RWW command detected by the memory device (e.g., via control 202 and/or 218). At 1104, one memory bank can undergo a read operation simultaneously while another memory bank undergoes a write operation at 1106. It should be noted that the read operation as described herein may also include a program or erase verify operation in order to test that a previously written value into a memory cell is correctly read out.

At 1108, the write input/output line IO_PE can transition in order to perform a write operation on the first (write) memory bank. At 1110, the read input/output line IO_RD can transition in order to simultaneously perform a read operation on the second memory bank. At 1112, suppression devices (e.g., 814-W) can be enabled in order to suppress noise due to the transition of shared read input/output line IO_RD as seen at the first (write) memory bank. At 1114, suppression devices (e.g., 816-R) can be enabled in order to suppress noise due to the transition of shared write input/output line IO_PE as seen at the second (read) memory bank. At 1116, isolation devices (e.g., 810-W) can be disabled in order to isolate noise due to the transition of shared read input/output line IO_RD as seen at the first (write) memory bank. At 1118, isolation devices (e.g., 808-R) can be disabled in order to isolate noise due to the transition of shared write input/output line IO_PE as seen at the second (read) memory bank.

In particular embodiments, a RWW operation can be enabled in order to allow the memory system to access the contents of the other memory sectors or banks while waiting for the write operation on a specific sector or bank to complete. This approach within a single NVM device provides a more cost effective RWW design, as compared to two or more NVM devices, such as in a multi-chip solution. This approach also reduces the bottleneck of program and erase times of the NVM, and also resolves the bottleneck of suspend and resume operations.

Also in particular embodiments, simultaneous read operations from different memory banks may be supported. For example, while primarily RWW operations are described herein, whereby a write occurs to one bank while a read occurs from another memory bank, certain embodiments also may support a read operation from one bank occurring simultaneously with a read operation from another bank. In one particular example, one of these read operations may be part of a verify operation that can occur in order to verify that a given write (program/erase) operation has succeeded. If such a write operation has not been sufficient to change the state of an appropriate memory cell, then the write operation can occur again (e.g., with adjusted write voltage and/or write pulse widths), followed by another verify/read operation. In another example, simultaneous read operations from multiple banks (e.g., parallel read operations) can occur as part of explicit read command(s). In any event, the suppression and isolation devices described herein can provide similar noise isolation and enhanced read performance using shared IO lines between dual/multiple memory banks.

Also in particular embodiments, any simultaneous operations that are supported by the memory array (e.g., from different memory banks) may be supported. For example, while primarily RWW operations are described herein, whereby a write occurs to one bank while a read occurs from another memory bank, certain embodiments also may support simultaneous read operations, simultaneous write operations, simultaneous verify operations, or any other suitable simultaneous operations. For example, one IO line may be allocated (e.g., during a given mode of operation) to one operation, while another IO line may be allocated to another operation, whereby the operations can be simultaneous and the IO lines may be shared among different portions (e.g., memory banks) of the memory array. In any case, the suppression and isolation devices described herein can provide similar noise isolation and enhanced operation performance using shared IO lines between dual/multiple memory banks, or other memory array portions.

In one embodiment, a selection circuit may be configured to multiplex between first and second IO lines, and bit lines in a memory array that simultaneously supports first and second operations. The first and second operations can be any suitable operations (e.g., read, write, verify, etc.) that may supported in simultaneous fashion across the memory array. For example, the selection circuit can include: (i) a plurality of selection devices configured to control simultaneous paths between the first and second IO lines and the bit lines, where the first IO line is allocated for the first operation, and the second IO line is allocated for the second operation; (ii) a plurality of suppression devices configured to suppress noise due to transitions on the first IO line during the second operation, and to suppress noise due to transitions on the second IO line during the first operation; and (iii) a plurality of isolation devices configured to isolate noise due to transitions on the first IO line during the second operation, and to isolate noise due to transitions on the second IO line during the first operation.

While the above examples include circuit, operational, and structural implementations of certain memory devices, one skilled in the art will recognize that other technologies and/or arrangements can be used in accordance with embodiments. Further, one skilled in the art will recognize that other device circuit arrangements, architectures, elements, and the like, may also be used in accordance with embodiments. In addition, other interfaces (e.g., parallel interfaces), signals, etc., may also be employed in certain embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A selection circuit configured to multiplex between shared read and write IO lines and bit lines in a memory array comprising first and second memory banks, the selection circuit comprising:
 a) a first selection device controllable by an address decoded write enable signal, and coupled between the write IO line and a first node;

b) a second selection device controllable by an address decoded read enable signal, and coupled between the read IO line and a second node;

c) a third selection device controllable by a first address decode signal, and coupled between a first bit line and a third node;

d) a fourth selection device controllable by a second address decode signal, and coupled between a second bit line and the third node;

e) a first suppression device controllable by a write enable signal, and coupled between the second node and a ground;

f) a second suppression device controllable by a read enable signal, and coupled between the first node and the ground;

g) a first isolation device controllable by the write enable signal, and coupled between the first node and the third node; and h) a second isolation device controllable by the read enable signal, and coupled between the second node and the third node.

2. The selection circuit of claim 1, wherein the first memory bank is configured to perform a read operation simultaneously with the second memory bank performing a write operation.

3. The selection circuit of claim 2, wherein the first suppression device is configured to suppress noise on the second node due to transitions on the read IO line during a write operation on the second memory bank.

4. The selection circuit of claim 2, wherein the second suppression device is configured to suppress noise on the first node due to transitions on the write IO line during a read operation on the first memory bank.

5. The selection circuit of claim 2, wherein the first isolation device is configured to isolate noise on the first node from affecting the third node due to transitions on the write IO line during a read operation on the first memory bank.

6. The selection circuit of claim 2, wherein the second isolation device is configured to isolate noise on the second node from affecting the third node due to transitions on the read IO line during a write operation on the second memory bank.

7. The selection circuit of claim 1, wherein the address decoded write enable signal is the same as the write enable signal, and the address decoded read enable signal is the same as the read enable signal.

8. The selection circuit of claim 1, wherein the write enable signal and the read enable signal are static signals, and the address decoded write enable signal and the address decoded read enable signal transition in each access cycle of the selection circuit.

9. A memory device, comprising a plurality of memory banks, wherein the selection circuit of claim 1 is replicated for each of the plurality of memory banks.

10. A method of controlling a memory device comprising the selection circuit of claim 1 replicated for each of the first and second memory banks, the method comprising:

a) during a read operation on the first memory bank, turning on the second suppression device and turning off the first isolation device; and b) during a write operation on the second memory bank, turning on the first suppression device and turning off the second isolation device, wherein the read operation and the write operation are simultaneous.

11. A selection circuit configured to multiplex between shared read and write IO lines and bit lines in a memory array comprising first and second memory banks, the selection circuit comprising:

a) a first selection device controllable by a first address decoded write enable signal, and coupled between the write IO line and a first node;

b) a second selection device controllable by a first address decoded read enable signal, and coupled between the read IO line and a second node;

c) a first suppression device controllable by the first address decoded write enable signal, and coupled between the second node and a ground;

d) a second suppression device controllable by the first address decoded read enable signal, and coupled between the first node and the ground;

e) a first selection/isolation device controllable by a second address decoded write enable signal, and coupled between a first bit line and the first node;

f) a second selection/isolation device controllable by a third address decoded write enable signal, and coupled between a second bit line and the first node;

g) a third selection/isolation device controllable by a fourth address decoded write enable signal, and coupled between the first bit line and the second node; and h) a fourth selection/isolation device controllable by a fifth address decoded write enable signal, and coupled between the second bit line and the second node.

12. The selection circuit of claim 11, wherein the first memory bank is configured to perform a read operation simultaneously with the second memory bank performing a write operation.

13. The selection circuit of claim 12, wherein the first suppression device is configured to suppress noise on the second node due to transitions on the read IO line during a write operation on the second memory bank.

14. The selection circuit of claim 12, wherein the second suppression device is configured to suppress noise on the first node due to transitions on the write IO line during a read operation on the first memory bank.

15. The selection circuit of claim 12, wherein at least one of the first and second selection/isolation devices and one of the third and fourth selection/isolation devices are configured to isolate noise on the first node from affecting the second node due to transitions on the write IO line during a read operation on the first memory bank.

16. The selection circuit of claim 12, wherein at least one of the third and fourth selection/isolation devices and one of the first and second selection/isolation devices are configured to isolate noise on the second node from affecting the first node due to transitions on the read IO line during a write operation on the second memory bank.

17. The selection circuit of claim 11, wherein each of the first and second selection devices, the first, second, third, and fourth selection/isolation devices, and the first and second suppression devices comprises an NMOS transistor.

18. A memory device, comprising a plurality of memory banks, wherein the selection circuit of claim 11 is replicated for each of the plurality of memory banks.

19. A method of controlling a memory device comprising the selection circuit of claim 11 replicated for each of the first and second memory banks, the method comprising:

a) during a read operation on the first memory bank, turning on the second suppression device and turning off the first and second selection/isolation devices and one of the third and fourth selection/isolation devices; and b) during a write operation on the second memory bank, turning on the first suppression device and turning off the third and fourth selection/isolation devices and one of the first and second selection/isolation devices.

20. A selection circuit configured to multiplex between first and second IO lines, and bit lines in a memory array that simultaneously supports first and second operations, the selection circuit comprising:

a) a plurality of selection devices configured to control simultaneous paths between the first and second IO lines and the bit lines, wherein the first IO line is allocated for the first operation, and the second IO line is allocated for the second operation;

b) a plurality of suppression devices configured to suppress noise due to transitions on the first IO line during the second operation, and to suppress noise due to transitions on the second IO line during the first operation; and c) a plurality of isolation devices configured to isolate noise due to the transitions on the first IO line during the second operation, and to isolate noise due to the transitions on the second IO line during the first operation.

* * * * *